(12) United States Patent
Nakatani

(10) Patent No.: US 6,281,934 B1
(45) Date of Patent: Aug. 28, 2001

(54) DATA SLICING DEVICE AND DATA SLICING METHOD FOR EXTRACTING DATA FROM A SIGNAL

(75) Inventor: Takashi Nakatani, Hyogo (JP)

(73) Assignees: Mitsubishi Electric System LSI Design Corporation, Itami; Mitsubishi Denki Kabushiki Kaisha, Tokyo, both of (JP)

( * ) Notice: Subject to any disclaimer, the term of this patent is extended or adjusted under 35 U.S.C. 154(b) by 0 days.

(21) Appl. No.: 09/167,660

(22) Filed: Oct. 7, 1998

(30) Foreign Application Priority Data

May 27, 1998 (JP) .................................................. 10-146143

(51) Int. Cl.$^7$ ....................................................... H04N 5/21
(52) U.S. Cl. ............................ 348/465; 348/625; 348/607
(58) Field of Search ..................................... 348/465, 625, 348/607, 619, 624, 630, 572; H04N 5/21

(56) References Cited

U.S. PATENT DOCUMENTS 5,325,093   6/1994   Takamori .

FOREIGN PATENT DOCUMENTS

| 44 03 910 | 10/1994 | (DE) . |
| 195 31 036 | 3/1996 | (DE) . |
| 60-72386 | 4/1985 | (JP) . |
| 62-84688 | 4/1987 | (JP) . |
| 62-175017 | 7/1987 | (JP) . |
| 9-331257 | 12/1997 | (JP) . |

*Primary Examiner*—Sherrie Hsia
(74) *Attorney, Agent, or Firm*—Burns, Doane, Swecker & Mathis, LLP

(57) ABSTRACT

A data slicing device includes an A/D converter for converting a video signal applied thereto into an equivalent digital signal, a sequential integrating circuit for averaging the amplitude of a dc component included in the digital signal obtained by the A/D converter, and a comparator for comparing a value of the digital signal obtained by the A/D converter with the average of the amplitude of the dc component obtained by the sequential integrating circuit so as to extract data from the digital signal.

11 Claims, 6 Drawing Sheets

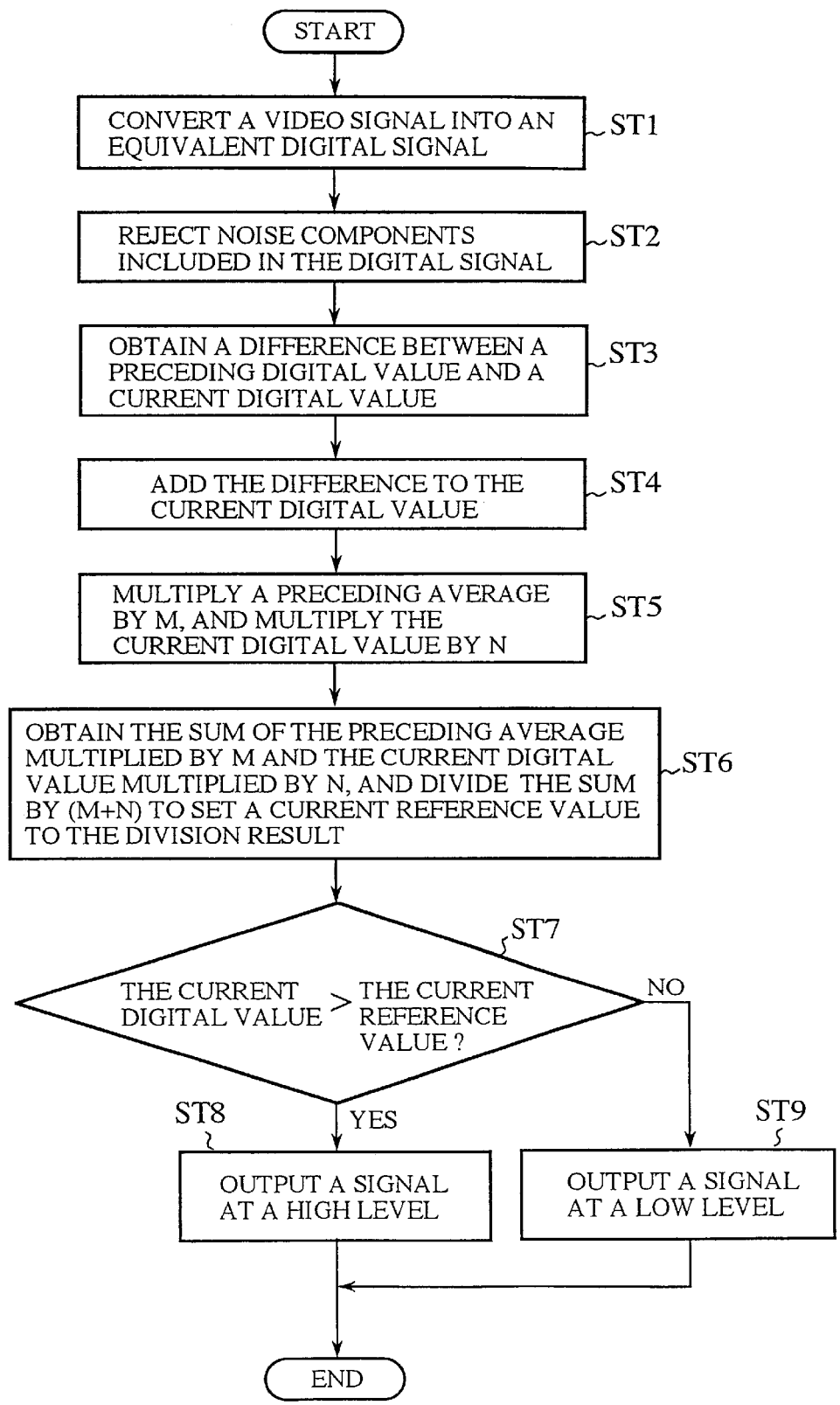

DATA SLICING DEVICE AND DATA SLICING METHOD FOR EXTRACTING DATA FROM A SIGNAL

BACKGROUND OF THE INVENTION

1. Field of the Invention

The present invention relates to a data slicing device and a data slicing method used for extracting either broadcast text data or TELETEXT signal that complies with the European standard, which are piggybacked onto a video signal, from the video signal.

2. Description of the Prior Art

Referring now to FIG. 8, there is illustrated a block diagram showing the structure of a prior art data slicing device. In the figure, reference numeral 1 denotes an A/D converter for converting a video signal into an equivalent digital signal at a rate n (n=2, 3, 4, . . . ) times as fast as the pulse repetition period of a clock run-in signal included in the video signal, 2 denotes a noise rejection circuit for rejecting noise components included in the digital signal obtained by the A/D converter 1, 3 denotes an amplifying circuit for detecting a variation in the digital signal or a transition of the digital signal whose noise components have been rejected or eliminated by the noise rejection circuit 2, and for amplifying the transition of the digital signal from the noise rejection circuit 2, 4 denotes a register for storing a reference value indicating a slice level, and 5 denotes a comparator for comparing the amplified transition of the digital signal from the amplifying circuit 3 with the reference value stored in the register 4 so as to extract data from the digital signal. FIG. 9 illustrates the waveform of a horizontal synchronizing signal for the video signal onto which data are piggybacked.

In operation, when the A/D converter 1 receives the video signal, it converts the video signal into an equivalent digital signal at a rate n (n=2, 3, 4, . . . ) times as fast as the pulse repetition period of a clock run-in signal included in the video signal. After the A/D converter 1 converts the video signal into an equivalent digital signal, the noise rejection circuit 2 eliminates noise components from the digital signal by averaging the values of any (n/2) or less pulses included in the digital signal. For example, when n=8 and the noise rejection circuit 2 averages any four successive pulses included in the digital signal, the noise rejection circuit 2 obtains the sum of the values of any four successive pulses included in the digital signal first, and then divides the sum by 4 to carry out averaging of the digital signal.

When the noise rejection circuit 2 eliminates noise components from the digital signal obtained by the A/D converter 1, the amplitude of the digital signal is reduced. The amplifying circuit 3 then differentiates the digital signal from the noise rejection circuit 2 so as to detect a transition of the digital signal. In other words, the amplifying circuit 3 obtains a difference between the values of a preceding pulse and a current pulse of the digital signal. The amplifying circuit 3 then adds the difference to the later one of the two digital values, i.e. the current digital value so as to amplify the amplitude of the digital signal from the noise rejection circuit 2. As a result, the difference between the preceding and current values of the digital signal is amplified and the transition of the digital signal is therefore enhanced.

After the amplifying circuit 3 amplifies the digital signal, the comparator 5 compares the current value of the digital signal from the amplifying circuit 3 with the reference value stored in the register 4 so as to extract data from the digital signal. If the value of the current pulse of the digital signal is greater than the reference value, the comparator 5 furnishes an output signal at a HIGH level for the pulse. Otherwise, the comparator 5 furnishes an output signal at a LOW level for the pulse.

While the prior art data slicing device which is so constructed as mentioned above can extract data piggybacked onto a video signal from the video signal, it has a problem in that when the amplitude of the video signal is low or when data signals of different peak-to-peak amplitudes are piggybacked onto the video signal, it cannot extract data precisely because the reference value stored in the register 4 does not always lie in the middle range of the values of all data to be extracted, i.e. in a range intermediate between the maximum and minimum amplitudes or values of the digital signal.

Except when data signals of different peak-to-peak amplitudes are piggybacked onto the video signal, the amplitude of the video signal is constant. However, if noise is piggybacked onto the video signal, the amplitude of a dc component included in the video signal is varied and hence the middle range of the values of data extracted from the video signal is varied. As a result, the reference value stored in the register 4 deviates from the middle range of the values of data to be extracted from the video signal. That's because it is difficult for the noise rejection circuit 2 to eliminate noise components from the video signal completely.

SUMMARY OF THE INVENTION

The present invention is made to overcome the above problem. It is therefore an object of the present invention to provide a data slicing device and a data slicing method capable of precisely-extracting data from a video signal even when the amplitude of the video signal is low or even when data signals of different peak-to-peak amplitudes are piggybacked onto the video signal.

In accordance with one aspect of the present invention, there is provided a data slicing device comprising: an A/D converter for converting a video signal applied thereto into an equivalent digital signal; an averaging unit for averaging the amplitude of a dc component included in the digital signal obtained by the A/D converter so as to obtain a current averaging result of the amplitude of the dc component; and an extracting unit for comparing a current value of the digital signal obtained by the A/D converter with the current averaging result obtained by the averaging unit so as to extract data from the digital signal.

Preferably, the averaging unit obtains the sum of a preceding averaging result multiplied by M (M is a natural number) and the current value of the digital signal multiplied by N (N is a natural number) and then divides the sum by (M+N) so as to obtain the current averaging result of the amplitude of the dc component.

In accordance with a preferred embodiment of the present invention, the averaging unit monitors the level of a data signal representing the data extracted by the extracting unit, and then performs the averaging operation on the amplitude of the dc component included in the digital signal only if it detects a transition of the data signal.

In accordance with another preferred embodiment of the present invention, the averaging unit monitors the level of a data signal representing the data extracted by the extracting unit, and then, after it detects a transition of the data signal, performs the averaging operation on the amplitude of the dc component included in the digital signal for a predetermined period of time.

In accordance with another preferred embodiment of the present invention, the averaging unit performs the averaging operation on the amplitude of the dc component included in the digital signal within only a clock run-in time period during which a clock run-in signal that partially composes the video signal is applied to the data slicing device.

Preferably, the data slicing device further comprises a noise rejection unit for rejecting noise components included in the digital signal obtained by the A/D converter.

Preferably, the data slicing device further can comprise an amplifying unit for detecting a transition of the digital signal obtained by the A/D converter and for then amplifying the transition of the digital signal.

In accordance with another preferred embodiment of the present invention, the data slicing device further comprises a noise rejection unit for rejecting noise components included in the digital signal obtained by the A/D converter, and an amplifying unit for detecting a transition of the digital signal whose noise components have been eliminated by the noise rejection unit and for then amplifying the transition of the digital signal.

In accordance with another aspect of the present invention, there is provided a data slicing method comprising the steps of: converting a video signal applied thereto into an equivalent digital signal; averaging the amplitude of a dc component included in the digital signal so as to obtain a current averaging result of the amplitude of the dc component; and comparing a current value of the digital signal with the current averaging result so as to extract data from the digital signal.

Preferably, in performing the averaging step, the sum of a preceding averaging result multiplied by M (M is a natural number) and the current value of the digital signal multiplied by N (N is a natural number) is obtained and then the sum is divided by (M+N) so as to obtain the current averaging result.

In accordance with a preferred embodiment of the present invention, in performing the averaging step, the level of a data signal representing the data extracted is monitored and then the averaging operation on the amplitude of the dc component included in the digital signal is performed only if a transition of the data signal is detected.

In accordance with another preferred embodiment of the present invention, in performing the averaging step, the level of a data signal representing the data extracted is monitored, and then, after a transition of the data signal is detected, the averaging operation on the amplitude of the dc component included in the digital signal is performed for a predetermined period of time.

In accordance with another preferred embodiment of the present invention, in performing the averaging step, the averaging operation on the amplitude of the dc component included in the digital signal is performed within only a clock run-in time period during which a clock run-in signal that partially composes the video signal is applied.

Further objects and advantages of the present invention will be apparent from the following description of the preferred embodiments of the invention as illustrated in the accompanying drawings.

BRIEF DESCRIPTION OF THE DRAWINGS

FIG. 2 is a flow diagram showing a data slicing method that the data slicing device according to the first embodiment of the present invention employs;

DETAILED DESCRIPTION OF THE PREFERRED EMBODIMENTS

First Embodiment

Figure 1:
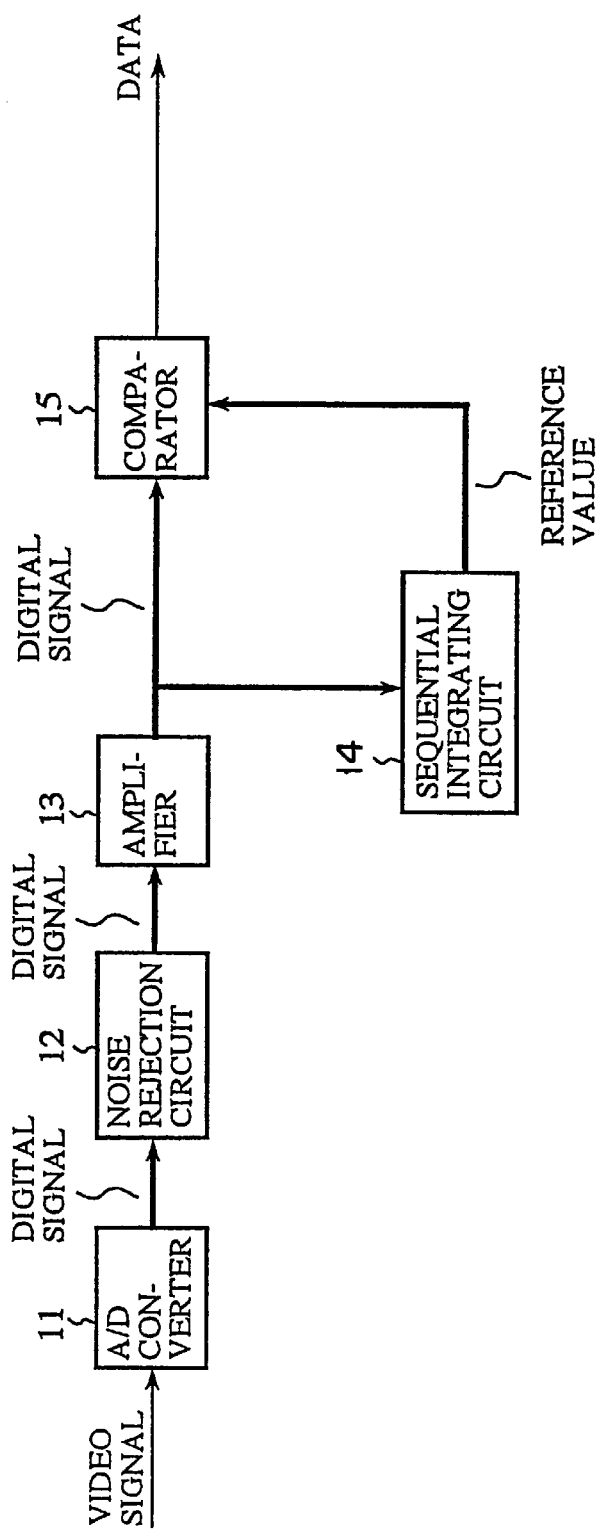
FIG. 1 is a block diagram showing the structure of a data slicing device according to a first embodiment of the present invention.

Referring next to FIG. 1, there is illustrated a block diagram showing the structure of a data slicing device according to a first embodiment of the present invention. In the figure, reference numeral 11 denotes an A/D converter for converting a video signal into an equivalent digital signal at a rate n (n=2, 3, 4, . . . ) times as fast as the pulse repetition period of a clock run-in signal included in the video signal, 12 denotes a noise rejection circuit for rejecting noise components included in the digital signal obtained by the A/D converter 11, 13 denotes an amplifying circuit for detecting a variation in the digital signal, i.e. a transition of the digital signal whose noise components have been eliminated or rejected by the noise rejection circuit 12, and for amplifying the transition of the digital signal from the noise rejection circuit, 14 denotes a sequential integrating circuit for averaging the amplitude of a dc component included in the digital signal from the amplifying circuit 13 so as to obtain a current averaging result of the amplitude of the dc component, and for furnishing the current averaging result, i.e. the mean amplitude of the dc component as a current reference value, and 15 denotes a comparator for comparing the amplified digital signal from the amplifying circuit 13 with the current reference value from the sequential integrating circuit 14 so as to extract data from the digital signal.

Referring next to FIG. 2, there is illustrated a flow diagram showing the data slicing method which the data slicing device according to the first embodiment of the present invention employs. In operation, when the A/D converter 11 accepts a video signal, it, in step ST1, converts the video signal applied thereto into an equivalent digital signal at a rate n (n=2, 3, 4, . . . ) times as fast as the pulse repetition period of the clock run-in signal applied thereto during the clock run-in time period. After the A/D converter 11 converts the video signal into an equivalent digital signal, the noise rejection circuit 12, in step ST2, averages the digital values of any (n/2) or less pulses included in the digital signal so as to reject noise components included in the digital signal. For example, when n=8 and the noise rejection circuit 12 averages any four successive pulses included in the digital signal, the noise rejection circuit 12 obtains the sum of the values of any four successive pulses included in the digital signal. The noise rejection circuit 12 then divides the sum by 4 to carry out averaging of the digital signal.

After the noise rejection circuit 12 eliminates noise components from the digital signal from the A/D converter 11, the amplitude of the digital signal is reduced. The amplifying circuit 3 then, in step ST3, differentiates the digital signal from the noise rejection circuit 12 so as to detect a variation in the digital signal, i.e. a transition from a preceding value to a current value of the digital signal. That is, the amplifying circuit 13 obtains a difference between the values of the corresponding preceding and current pulses of the digital signal, and then, in step ST4, adds the difference to the later one of the two digital values, i.e. the current digital value so as to amplify the amplitude of the digital signal from the noise rejection circuit 12. As a result, the difference between the preceding -and current values of the digital signal is amplified and the transition of the digital signal is therefore enhanced.

After the amplifying circuit 13 amplifies the amplitude of the digital signal, the sequential integrating circuit 14, in step ST5, multiplies the preceding reference value, which is the preceding averaging result or average of the amplitude of the dc component included in the digital signal, by M, e.g. 7, and multiplies the current value of the digital signal from the amplifying circuit 13 by N. e.g. 1, in order to determine the current reference value which the comparator 15 will use next. The reference value indicates a slice level that lies in a range intermediate between the maximum and minimum amplitudes or values of the video signal, i.e. in the middle range of the values of all data to be extracted. The sequential integrating circuit 14 then, in step ST6, obtains the sum of the preceding reference value multiplied by M and the current value of the digital signal multiplied by N, and divides the sum by (M+N) so as to obtain the current averaging result or average of the amplitude of the dc component included in the digital signal from the amplifying circuit 13. The sequential integrating circuit 14 sets the current reference value, which the comparator 15 will use next, to the obtained current average of the amplitude of the dc component. In other words, the sequential integrating circuit 14 furnishes the obtained current average of the amplitude of the dc component, as the current reference value, to the comparator 15.

Figure 3:
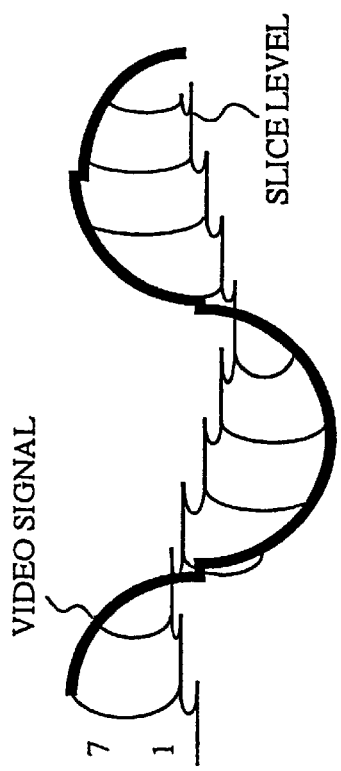
FIG. 3 is a diagram showing the waveforms of a video signal and a slice level obtained by averaging of the amplitude of a dc component included in the video signal, which varies as the amplitude of the video signal varies.

Referring next to FIG. 3, there is illustrated the waveforms of examples of the video signal and the slice level obtained by averaging of the amplitude of the dc component included in the video signal when M is set to 7 and N is set to 1. As can be seen from FIG. 3, the slice level varies as the video signal varies in amplitude. The slice level can vary so that it lies in the middle range intermediate between the maximum and minimum values of the video signal. In other words, the slice level lies in the middle range of the values of all data to be extracted from the video signal.

Then the comparator 5, in step ST7, compares the current value of the digital signal from the amplifying circuit 3 with the current reference value furnished by the sequential integrating circuit 14 so as to extract data from the digital signal. If the current value of the digital signal from the amplifying circuit is greater than the current reference value, the comparator 5, in step ST8, furnishes an output signal at a HIGH level. Otherwise, the comparator 5, in step ST9, furnishes an output signal at a LOW level.

As previously mentioned, the data slicing device according to the first embodiment of the present invention is so constructed as to average the amplitude of a dc component included in the digital signal amplified by the amplifying circuit 13 and to compare the averaging result with the digital signal. Accordingly, the first embodiment offers an advantage of being able to extract data from the video signal precisely even when the amplitude of the video signal is low or even when data signals of different peak-to-peak amplitudes are piggybacked onto the video signal.

Second Embodiment

Figure 4:
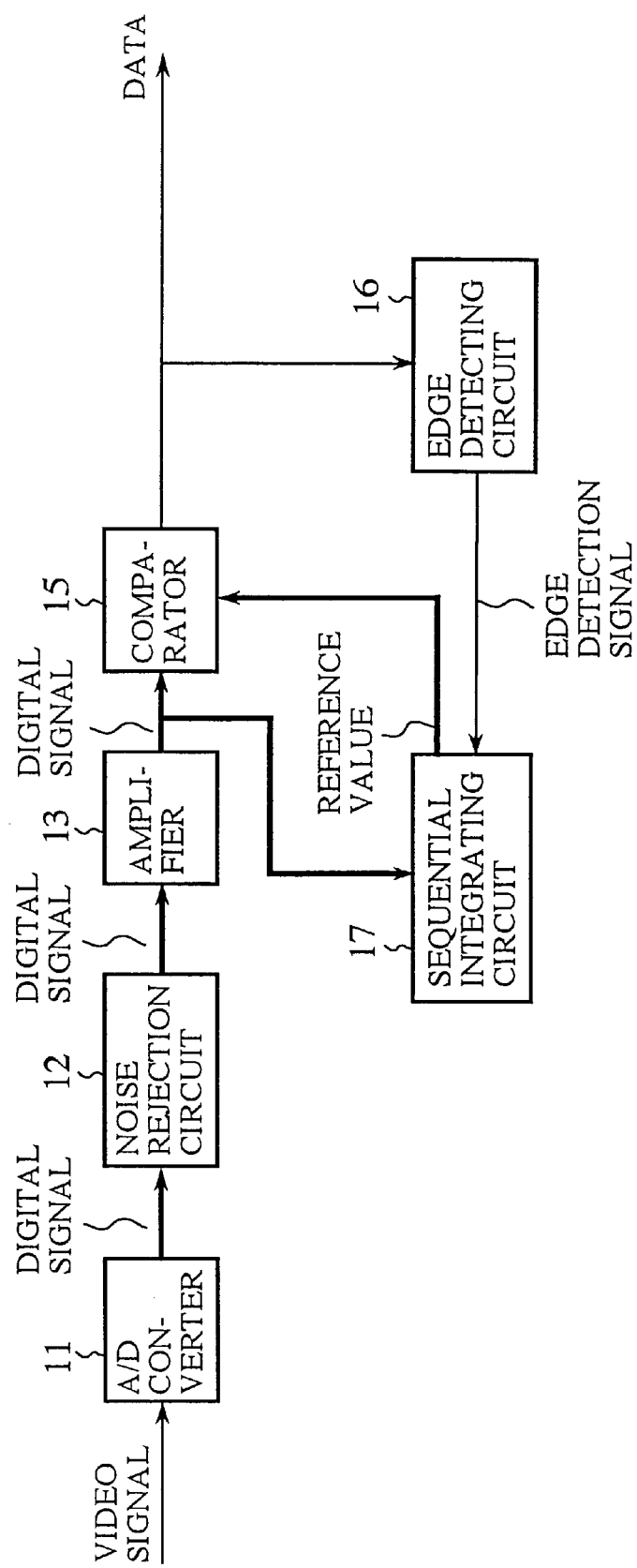
FIG. 4 is a block diagram showing the structure of a data slicing device according to a second embodiment of the present invention.

Referring next to FIG. 4, there is illustrated a block diagram showing the structure of a data slicing device according to a second embodiment of the present invention. In the figure, since the same reference numerals as shown in FIG. 1 denote the same or like components as of the first embodiment mentioned above, the description of those components will be omitted hereafter. Reference numeral 16 denotes an edge detecting circuit for monitoring the level of a data signal representing data extracted by the comparator 15 so as to detect a transition or an edge of the data signal, and for furnishing an edge detection signal asserted every time it detects an edge of the data signal, and 17 denotes a sequential integrating circuit for performing an averaging operation on the amplitude of a dc component included in the digital signal only if the edge detecting circuit 16 furnishes an edge detection signal asserted.

In the above-mentioned first embodiment, the sequential integrating circuit 14 as shown in FIG. 1 is so constructed as to perform an averaging operation on the amplitude of the dc component included in the digital signal at all times. In this case, there is a possibility that unless the level of the data signal representing data extracted from the digital signal is varied for a certain period of time, for example, if the level of the data signal is held at a HIGH or LOW level for a certain period of time, the reference value furnished by the sequential integrating circuit 14 agrees with the value of data to be extracted from the digital signal.

On the contrary, the sequential integrating circuit 17 according to the second embodiment of the present invention does not perform the averaging operation on the amplitude of the dc component included in the digital signal, but furnishes the immediately preceding reference value to the comparator so as to prevent the slice level from being biased unless the level of the data signal representing data extracted from the digital signal is varied for a certain period of time. The edge detecting circuit 16 monitors the level of the data signal representing data extracted by the comparator 15. Every time the edge detecting circuit 16 detects a transition or edge of the data signal, it furnishes an edge detection signal asserted. The sequential integrating circuit 17 performs the averaging operation on the amplitude of the dc component included in the digital signal only if the edge detecting circuit 16 furnishes an edge detection signal asserted to the sequential integrating circuit 17.

As previously mentioned, the data slicing device according to the second embodiment of the present invention is so constructed as to average the amplitude of a dc component included in the digital signal amplified by the amplifying circuit 13 only if the edge detecting circuit 16 furnishes an edge detection signal asserted. Accordingly, the second embodiment offers an advantage of being able to extract data from the video signal precisely even though the level of the data signal representing data extracted from the digital signal is not varied for a certain period of time.

Third Embodiment

Figure 5:
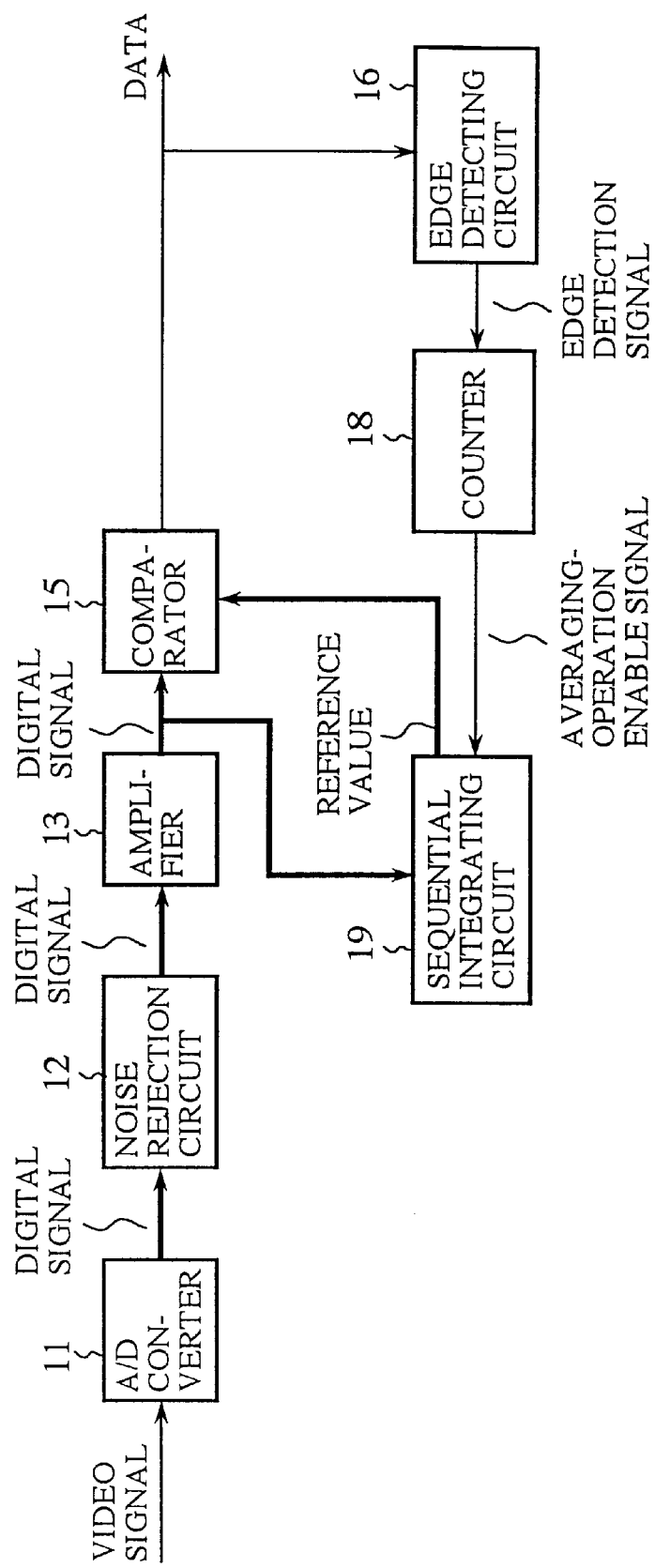
FIG. 5 is a block diagram showing the structure of a data slicing device according to a third embodiment of the present invention.

Referring next to FIG. 5, there is illustrated a block diagram showing the structure of a data slicing device according to a third embodiment of the present invention. In the figure, since the same reference numerals as shown in FIG. 4 denote the same or like components as of the second embodiment, the description of those components will be omitted hereafter. Reference numeral 18 denotes a counter for furnishing an averaging-operation enable signal asserted for a predetermined period of time every time an edge detecting circuit 16 furnishes an edge detection signal asserted, and 19 denotes a sequential integrating circuit for continuously performing an averaging operation on the amplitude of a dc component included in the digital signal from the amplifying circuit 13 as long as it receives the averaging-operation enable signal asserted from the counter 18.

In the above-mentioned second embodiment, the sequential integrating circuit 17 is so constructed as to perform the averaging operation on the amplitude of a dc component included in the digital signal only if the edge detecting circuit detects a transition of a data signal representing data extracted from the digital signal from the amplifying circuit. In this case, it takes a long time for the slice level to become stable because the sequential integrating circuit 17 of the second embodiment does not perform the averaging operation on the amplitude of the dc component included in the digital signal as long as the edge detecting circuit does not detect a transition of the data signal representing data extracted.

On the contrary, in order to shorten the time required for the slice level to become stable as well as to prevent the slice level from being biased, the data slicing device according to the third embodiment of the present invention is so constructed that the counter 18 furnishes an averaging-operation enable signal asserted for a predetermined period of time every time the edge detecting circuit 16 furnishes an edge detection signal, and the sequential integrating circuit 19 continuously performs the averaging operation on the amplitude of the dc component included in the digital signal as long as it receives the averaging-operation enable signal asserted from the counter 18. The longer the predetermined period of time during which the edge detection circuit 16 furnishes the averaging-operation enable signal, the shorter the time required for the slice level to become stable.

As previously mentioned, the data slicing device according to the third embodiment of the present invention is so constructed as to continuously perform the averaging operation on the amplitude of the dc component included in the digital signal amplified by the amplifying circuit 13 for a predetermined period of time after the edge detecting circuit 16 furnishes an edge detection signal. Accordingly, the third embodiment of the present invention offers an advantage of being able to shorten the time required for the slice level to become stable as well as to prevent the slice level from being biased.

Fourth Embodiment

Figure 6:
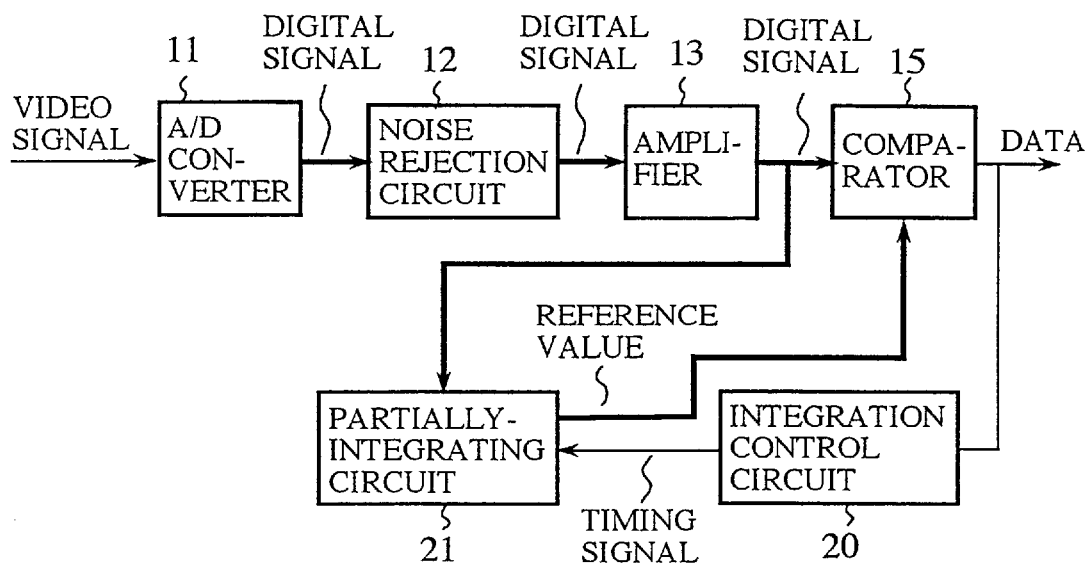
FIG. 6 is a block diagram showing the structure of a data slicing device according to a fourth embodiment of the present invention.

Referring next to FIG. 6, there is illustrated a block diagram showing the structure of a data slicing device according to a fourth embodiment of the present invention. In the figure, since the same reference numerals as shown in FIG. 1 denote the same or like components as of the first embodiment mentioned above, the description of those components will be omitted hereafter. Reference numeral 20 denotes an integration control circuit for furnishing a timing signal asserted for n pulse repetition periods of a clock run-in signal, which partially composes a video signal, applied thereto within a clock run-in time period, and 21 denotes a partially-integrating circuit for continuously performing an averaging operation on the amplitude of a dc component included in the digital signal from the amplifying circuit 13 as long as it receives the timing signal from the integration control circuit 20.

In the above-mentioned third embodiment, the sequential integrating circuit 19 is so constructed as to perform the averaging operation on the amplitude of the dc component included in the digital signal as long as the counter 18 furnishes the averaging-operation enable signal asserted. On the contrary, the partially-integrating circuit 21 according to the fourth embodiment of the present invention is so constructed as to perform the averaging operation on the amplitude of the dc component included in the digital signal from the amplifying circuit 13 within only the clock run-in time period during which the clock run-in signal is applied thereto.

Figure 7:
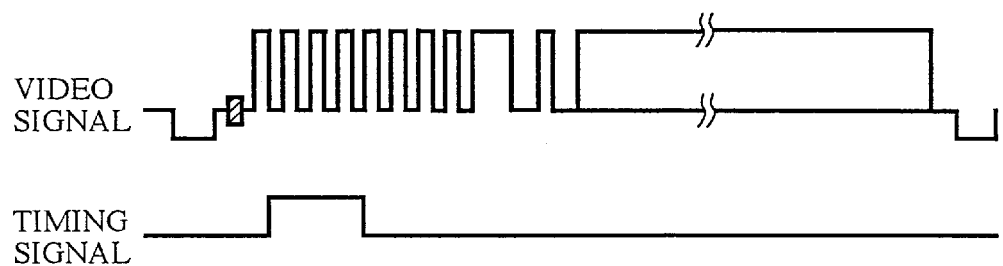
FIG. 7 is a diagram showing the waveforms of a video signal and a timing signal.
Figure 8:
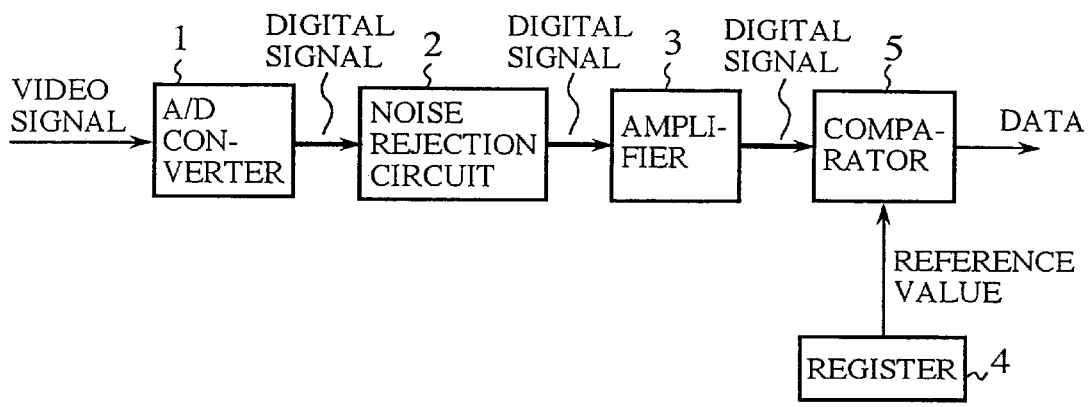
FIG. 8 is a block diagram showing the structure of a prior art data slicing device.
Figure 9:
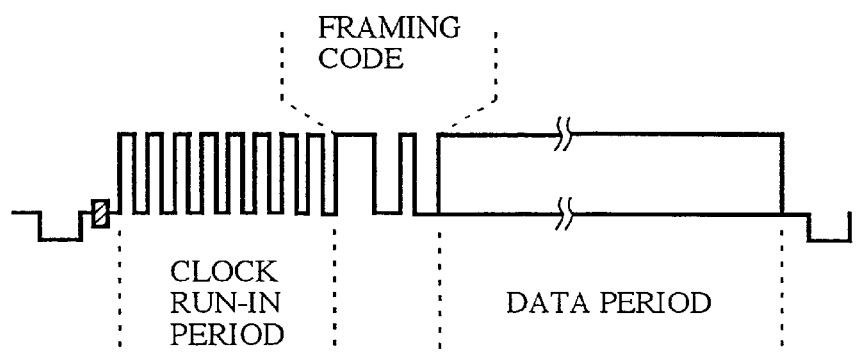
FIG. 9 is a diagram showing the waveform of a horizontal synchronizing signal for a video signal onto which data are piggybacked.

When the integration control circuit 20 detects a clock run-in signal applied thereto during the clock run-in time period, it continues to furnish a timing signal asserted to the partially-integrating circuit 21 for n pulse repetition periods of the clock run-in signal, as shown in FIG. 7. As long as the partially-integrating circuit 21 receives the timing signal asserted from the integration control circuit 21, it can continuously perform the averaging operation on the amplitude of the dc component included in the digital signal from the amplifying circuit 13. As a result, the partially-integrating circuit 21 furnishes a reference value indicating the average of the amplitude of the dc component that lies in a range intermediate between the maximum and minimum values of the clock run-in signal to the comparator 15. Accordingly, the comparator 15 extracts data from the video signal precisely.

Many widely different embodiments of the present invention may be constructed without departing from the spirit and scope of the present invention. It should be understood that the present invention is not limited to the specific embodiments described in the specification, except as defined in the appended claims.

What is claimed is:

1. A data slicing device comprising:
   converting means for converting a video signal applied thereto into an equivalent digital signal;
   averaging means for averaging the amplitude of a dc component included in said digital signal obtained by said converting means so as to obtain a current averaging result of the amplitude of the dc component; and
   comparing means for comparing a current value of said digital signal obtained by said converting means with the current averaging result obtained by said averaging means so as to extract data from said digital signal,
   wherein said averaging means obtains a sum of a preceding averaging result multiplied by a first natural number (M) and the current value of the digital signal multiplied by a second natural number (N) and then divides the sum obtained in such a way by the sum of the first and second natural numbers (M+N) so as to obtain the current averaging result of the amplitude of the dc component.

2. The data slicing device according to claim 1, wherein said averaging means monitors the level of a data signal representing the data extracted by said extracting means and then performs the averaging operation on the amplitude of the dc component included in said digital signal only if it detects a transition of the data signal.

3. The data slicing device according to claim 1, wherein said averaging means monitors the level of a data signal representing the data extracted by said extracting means, and then, after it detects a transition of the data signal, performs the averaging operation on the amplitude of the dc component included in said digital signal for a predetermined period of time.

4. The data slicing device according to claim 1, wherein said averaging means performs the averaging operation on the amplitude of the dc component included in said digital signal within only a clock run-in time period during which a clock run-in signal that partially composes the video signal is applied to said data slicing device.

5. The data slicing device according to claim 1, further comprising a noise rejection means for rejecting noise components included in said digital signal obtained by said converting means.

6. The data slicing device according to claim 1, further comprising an amplifying means for detecting a transition of said digital signal obtained by said converting means and for then amplifying the transition of said digital signal.

7. The data slicing device according to claim 1, further comprising a noise rejection means for rejecting noise components included in said digital signal obtained by said converting means, and an amplifying means for detecting a transition of said digital signal whose noise components have been eliminated by said noise rejection means and for then amplifying the transition of said digital signal.

8. A data slicing method comprising the steps of:
 converting a video signal applied thereto into an equivalent digital signal;
 averaging the amplitude of a dc component included in said digital signal so as to obtain a current averaging result of the amplitude of the dc component; and
 comparing a current value of said digital signal with the current averaging result so as to extract data from said digital signal,
 wherein in performing the averaging step, a sum of a preceding averaging result multiplied by a first natural number (M) and the current value of the digital signal multiplied by a second natural number (N) is obtained and then the sum obtained in such a way is divided by the sum of the first and second natural numbers (M+N) so as to obtain the current averaging result.

9. The data slicing according to claim 8, wherein in performing the averaging step, the level of a data signal representing the data extracted is monitored and then the averaging operation on the amplitude of the dc component included in said digital signal is performed only if a transition of the data signal is detected.

10. The data slicing according to claim 8, wherein in performing the averaging step, the level of a data signal representing the data extracted is monitored, and then, after a transition of the data signal is detected, the averaging operation on the amplitude of the dc component included in said digital signal is performed for a predetermined period of time.

11. The data slicing according to claim 8, wherein in performing the averaging step, the averaging operation on the amplitude of the dc component included in said digital signal is performed within only a clock run-in time period during which a clock run-in signal that partially composes the video signal is applied.

* * * * *